United States Patent
Vogelsang

(10) Patent No.: US 7,375,999 B2
(45) Date of Patent: May 20, 2008

(54) LOW EQUALIZED SENSE-AMP FOR TWIN CELL DRAMS

(75) Inventor: Thomas Vogelsang, Jericho, VT (US)

(73) Assignee: Infineon Technologies AG, Munich (DE)

( * ) Notice: Subject to any disclaimer, the term of this patent is extended or adjusted under 35 U.S.C. 154(b) by 184 days.

(21) Appl. No.: 11/241,592

(22) Filed: Sep. 29, 2005

(65) Prior Publication Data

US 2007/0070754 A1    Mar. 29, 2007

(51) Int. Cl.
*G11C 11/24* (2006.01)
*G11C 7/00* (2006.01)

(52) U.S. Cl. ............ 365/149; 365/203; 365/205; 365/207; 365/208

(58) Field of Classification Search ............ 365/149, 365/205, 207, 208, 222, 230.03, 203
See application file for complete search history.

(56) References Cited

U.S. PATENT DOCUMENTS

| | | | | |
|---|---|---|---|---|
| 5,329,479 | A * | 7/1994 | Ota et al. | 365/149 |
| 5,905,685 | A * | 5/1999 | Nakamura et al. | 365/207 |
| 5,970,007 | A * | 10/1999 | Shiratake | 365/207 |
| 6,320,798 | B1 * | 11/2001 | Jo et al. | 365/205 |
| 6,344,990 | B1 * | 2/2002 | Matsumiya et al. | 365/149 |
| 6,449,204 | B1 * | 9/2002 | Arimoto et al. | 365/222 |
| 6,597,599 | B2 * | 7/2003 | Morihara et al. | 365/149 |
| 6,700,826 | B2 * | 3/2004 | Ito | 365/222 |
| 6,738,282 | B2 * | 5/2004 | Jo | 365/149 |
| 6,775,177 | B2 * | 8/2004 | Okamoto et al. | 365/149 |
| 6,781,915 | B2 * | 8/2004 | Arimoto et al. | 365/230.03 |
| 6,788,590 | B2 * | 9/2004 | Parris et al. | 365/149 |
| 6,850,449 | B2 * | 2/2005 | Takahashi | 365/222 |
| 6,909,644 | B2 * | 6/2005 | Fujioka et al. | 365/207 |
| 6,917,558 | B2 * | 7/2005 | Matsuoka et al. | 365/230.01 |
| 6,925,022 | B2 * | 8/2005 | Arimoto et al. | 365/222 |
| 7,012,831 | B2 * | 3/2006 | Shigenami et al. | 365/149 |
| 7,072,204 | B2 * | 7/2006 | Tsukikawa et al. | 365/149 |
| 7,139,208 | B2 * | 11/2006 | Arimoto et al. | 365/222 |
| 7,177,216 | B2 * | 2/2007 | Suh et al. | 365/205 |
| 7,193,884 | B2 * | 3/2007 | Sekiguchi et al. | 365/149 |
| 7,200,061 | B2 * | 4/2007 | Sekiguchi et al. | 365/207 |
| 7,248,495 | B2 * | 7/2007 | Arimoto et al. | 365/149 |

\* cited by examiner

*Primary Examiner*—Trong Phan
(74) *Attorney, Agent, or Firm*—Patterson & Sheridan, L.L.P.

(57) ABSTRACT

Embodiments of the invention provide a method and apparatus for accessing a twin cell memory device. In one embodiment, a twin memory cell is accessed using a first bitline and a second bitline. The method includes precharging the first bitline and the second bitline to a low voltage. A wordline voltage is asserted to access the twin memory cell. A voltage difference between the first and second bitline is created by a data value and a complement of the data value stored in the twin memory cell, and the voltage difference is sensed.

20 Claims, 6 Drawing Sheets

LOW EQUALIZED SENSE-AMP FOR TWIN CELL DRAMS

BACKGROUND OF THE INVENTION

1. Field of the Invention

The invention generally relates to semiconductor memory devices. Specifically, the invention relates to reducing power consumption in semiconductor memory devices.

2. Description of the Related Art

Modern semiconductor memory devices are typically used in a wide variety of electronic devices such as portable data assistants (PDAs), cell phones, and the like. Because the electronic devices are typically powered by batteries, there is a desire to reduce power consumption of the memory devices.

One type of memory device with reduced power consumption is a twin cell dynamic random access memory (twin cell DRAM). FIG. 1 is a circuit diagram depicting an exemplary memory cell 100 of a twin cell DRAM. As depicted, the memory cell 100 may contain two NMOS access transistors 112, 114 which are used to access two capacitors 122, 124 which store data for the memory cell 100. The NMOS transistors 112, 114 may be controlled by a wordline WL 106 connected to the gates of the transistors 112, 114. The memory cell 100 typically stores a binary bit of information and a complement of the bit (e.g., a '0 and 1', respectively, or a '1' and a '0', respectively). The bit and the complement of the bit may be stored as charges in the capacitors 122, 124. When the memory cell 100 is accessed, the stored bit and the complement of the bit may be output on a bitline (bitline true, BLt) 104 and a complementary bitline (BLc) 102, respectively.

FIG. 2 is a timing diagram depicting an exemplary access of the memory cell 100. At some time $T_0$ before the access, the wordline voltage $V_{WL}$ may be a low voltage (e.g., a ground voltage $V_{GND}$ or a wordline off voltage $V_{WLOFF}$), thereby disconnecting capacitors 122, 124 from the bitlines 102, 104. In some cases, $V_{WLOFF}$ may be a low voltage which is boosted downward by a charge pump. As depicted, a high voltage ($V_{NT}=V_{CC}$) representing a logic value '1' may be stored in the "true" capacitor 122 of the memory cell 100 and a low voltage ($V_{NC}=V_{GND}$) representing a logic value '0' may be stored in the complementary capacitor 124.

Before the memory cell 100 is accessed, the bitlines 102, 104 may be precharged (also referred to as equalized) to a precharge voltage (the equalize voltage, $V_{BLEQ}$). Precharging may be performed to equalize a voltage level remaining on the bitlines 102, 104 from a previous access which used the bitlines 102, 104. Precharging prevents destruction of data stored in the memory cell 100 and allows the small voltage signals used to store information in the memory cell 100 to be properly sensed.

The access of the memory cell 100 may begin at time $T_1$ when $V_{WL}$ is asserted to the wordline on voltage $V_{WLON}$. $V_{WLON}$ may be sufficient to turn the NMOS transistors 112, 114 on (e.g., to place the transistors 112, 114 in a conducting state). In some cases, $V_{WLON}$ may be a high voltage ($V_{PP}$) which is boosted upward by a charge pump. When the NMOS transistors 112, 114 are turned on, the voltages $V_{NT}$, $V_{NC}$ stored in the capacitors 122, 124 may be driven onto the bitlines 102, 104, thereby pulling $V_{NT}$ down and $V_{NC}$ up towards $V_{BLEQ}$. As the voltages stored in the capacitors 122, 124 are driven onto the bitlines 102, 104, a voltage difference ($V_{BLT}-V_{BLC}$) between the voltage of the true ($V_{BLT}$) and complementary ($V_{BLC}$) bitlines 122, 124 may be created, e.g., by time $T_2$.

At time $T_3$, a sense amplifier connected to the bitlines 102, 104 may be enabled. The sense amplifier may be used to sense and amplify the voltage difference $V_{BLT}-V_{BLC}$ created by the memory cell 100 on the bitlines 102, 104. Thus, at time $T_3$ and continuing to time $T_4$, the voltage difference $V_{BLT}-V_{BLC}$ may be amplified, driving $V_{BLT}$ upwards to the bitline high voltage ($V_{BLH}$) and driving $V_{BLC}$ downwards to the bitline low voltage ($V_{BLL}$). Because the transistors 112, 114 may continue to be turned on (e.g., because $V_{WL}=V_{WLON}$), $V_{NT}$ may also be driven upwards to $V_{BLH}$ while $V_{NC}$ is driven downwards to $V_{BLL}$. In some cases, the voltages stored in $V_{NT}$ and $V_{NC}$ deteriorate over time, e.g., due to leakage from the memory cell 100. However, when the depicted access is performed and $V_{NT}$ is driven to $V_{BLH}$ and $V_{NC}$ is driven to $V_{BLL}$ (or vice versa), the values stored by the capacitors 122, 124 in the memory cell 100 are refreshed.

At time $T_5$, $V_{WL}$ may be lowered (e.g., to $V_{WLOFF}$ or $V_{GND}$), thereby disconnecting the capacitors 122, 124 from the bitlines 102, 104 and completing the access. Later, at time $T_6$, the bitlines 102, 104 may be precharged by driving $V_{BLT}$ and $V_{BLC}$ to $V_{BLEQ}$, thereby preparing the bitlines 102, 104 for a subsequent access.

In some cases, leakage mechanisms in the memory cell 100 may increase the power consumption of the memory device. In low power applications, reducing such leakage mechanisms may become important. One example of a leakage mechanism is a bitline-wordline (BL-WL) short 130, depicted in FIG. 1, formed between a bitline and a wordline. When the bitlines 102, 104 are precharged (e.g., as depicted at time $T_0$) to $V_{BLEQ}$ and the wordline voltage is lowered (deactivating the wordline 106), a voltage difference $V_{WL}-V_{BLC}=V_{BLEQ}-V_{WLOFF}$ (or $V_{WL}-V_{BLC}=V_{BLEQ}-V_{GND}$) may develop across the short 130, causing current to flow across the short 130 between the wordline 106 and bitline 102, thereby consuming power.

Another example of a leakage mechanism which may occur during precharge is diffusion leakage (also referred to as junction leakage). Diffusion leakage may be cause by a diffusion leakage current ($I_L$) from a junction, for example, a source of a transistor which is turned off, into a well or substrate in which the junction is located. The leakage current is similar to a reverse-biased diode leakage, with the junction and the well forming the reverse-biased diode.

As depicted in FIG. 1, the junction leakage $I_L$ may flow from the bitline side of transistors 112, 114 to the bitlines 102, 104. During precharge, the voltage drop from across the junction from the bitlines 102, 104 to the substrate may be $V_{BLEQ}-V_{BB}$, where $V_{BB}$ is the back bias voltage of the transistor 112, 114. In some cases, $V_{BB}$ may be a low voltage (e.g., $V_{GND}$) or a downward driven low voltage (e.g., a voltage lower than $V_{GND}$). Because the junction leakage may be proportional to the junction voltage ($V_{BLEQ}-V_{BB}$, during precharge), the junction leakage current, and thus the power consumption, during precharge may be substantial.

As described above, the bitlines 102, 104 in the memory device may be precharged between accesses, e.g., during a standby mode. In some cases, the memory device may spend a majority of the time in standby mode (with the bitlines 102, 104 being precharged), e.g., while waiting for user input to the electronic device containing the memory device. Accordingly, the current consumption during precharge and/or a standby mode, typically classified as standby current, is an important parameter in low power memory devices.

Accordingly, what is needed is a method and apparatus for reducing power consumption of a memory device.

SUMMARY OF THE INVENTION

Embodiments of the invention generally provide method and apparatus for accessing a twin cell memory device. In one embodiment, the memory device includes a twin memory cell. The twin memory cell stores a data value and a complement of the data value. The data value and the complement of the data value may be accessed via a first bitline and a second bitline of the memory device, respectively. The method includes precharging the first bitline and the second bitline to a low voltage. In one embodiment, the low voltage is a ground voltage or a voltage lower than the ground voltage of the memory device. The method further includes asserting a wordline voltage to access the twin memory cell and sensing a voltage difference between the first and second bitline of the memory device, the voltage difference created by the data value and the complement of the data value.

One embodiment provides a memory device including a plurality of twin memory cells, wherein each twin memory cell includes first and second access transistors controlled by a wordline to connect first and second capacitors, with voltages representing complementary data values, to first and second bitlines, respectively. The memory device also includes control circuitry configured to deactivate the wordline by lowering a wordline voltage of the wordline to a wordline off voltage, wherein the wordline off voltage is lower than a ground voltage of the memory device. The control circuitry is further configured to precharge the plurality of first and second bitlines to a low voltage, wherein the low voltage is one of the ground voltage, the wordline off voltage, and a back bias voltage, wherein the back bias voltage is a voltage applied to a substrate of the memory device.

One embodiment provides a method of accessing a twin cell memory device. The memory device comprises a twin memory cell, wherein the twin memory cell stores a data value and a complement of the data value, and wherein the data value and the complement of the data value may be accessed via a first bitline and a second bitline of the memory device, respectively. The method includes applying a selected precharge voltage to the memory device during a test of the memory device, precharging the first bitline and the second bitline to a selected low voltage, wherein the low voltage is selected at least between two of a ground voltage, a wordline off voltage used to deactivate a wordline of the twin cell memory device, and a back bias voltage applied to a substrate of the twin cell memory device. The method also includes accessing the twin memory cell after the test. Accessing the memory cell includes asserting a wordline voltage of a wordline used to control access to the memory cell and sensing a voltage difference between the first and second bitline of the memory device, the voltage difference created by the data value and the complement of the data value.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a method of operating a memory device. In one embodiment, during a precharge of the memory device, first and the second bitlines are lowered to a ground voltage. Because the first bitline and the second bitlines are precharged to a low voltage, power consumption of the memory device, e.g., due to a current across a bitline-wordline short or due to a junction leakage current in the twin memory cell, is reduced.

Voltages, voltage names, and signals names described herein are merely exemplary. Similarly, circuits, circuit arrangements, and methods of operating the circuits described herein are merely exemplary. In general, embodiments of the invention are described herein may be adapted for use with any semiconductor device, including a semiconductor device which is not solely a memory device or a memory device arranged in a manner other than as described herein.

An Exemplary Memory Device

Figure 1:
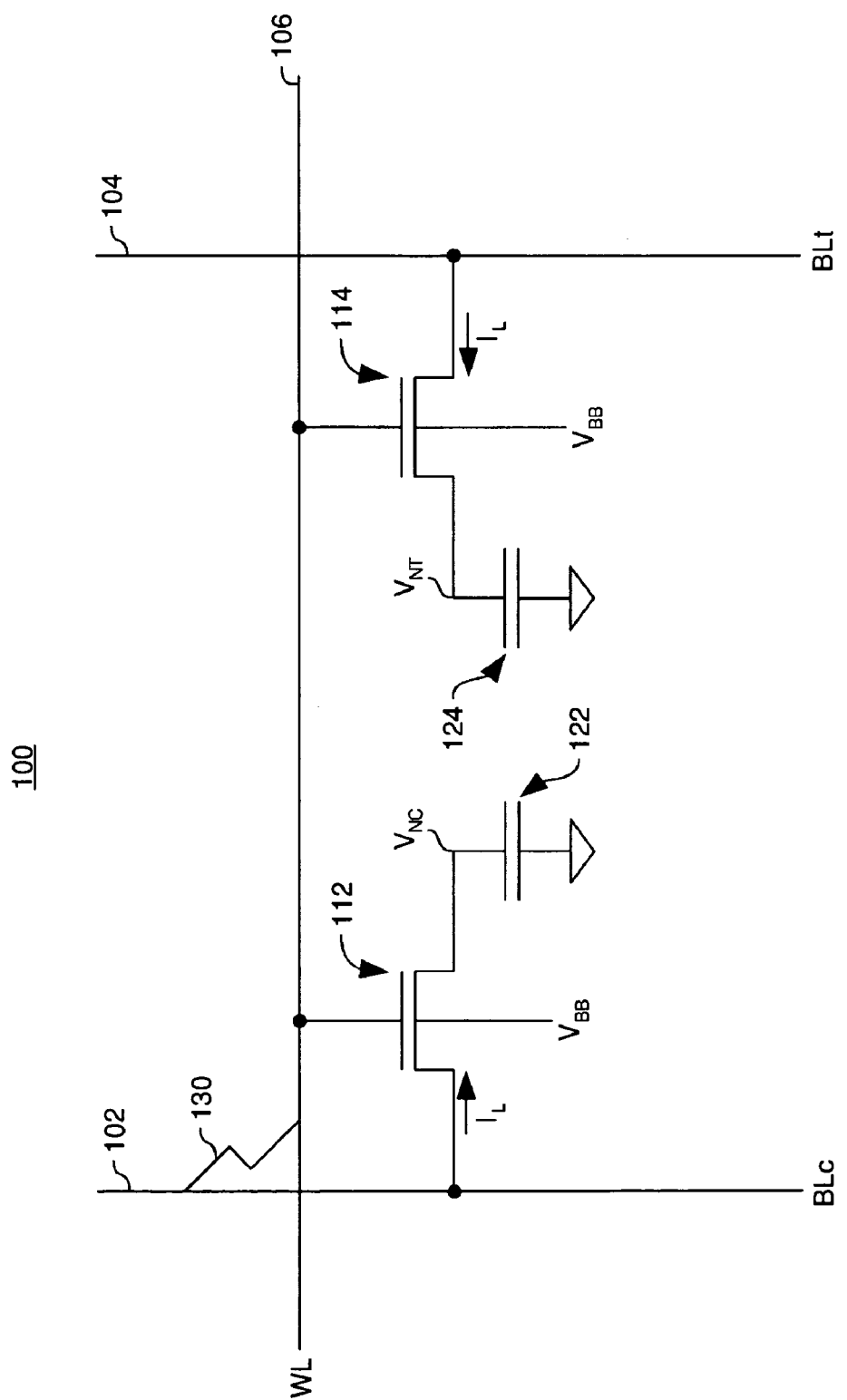
FIG. 1 is a circuit diagram depicting an exemplary memory cell of a twin cell DRAM.
Figure 2:
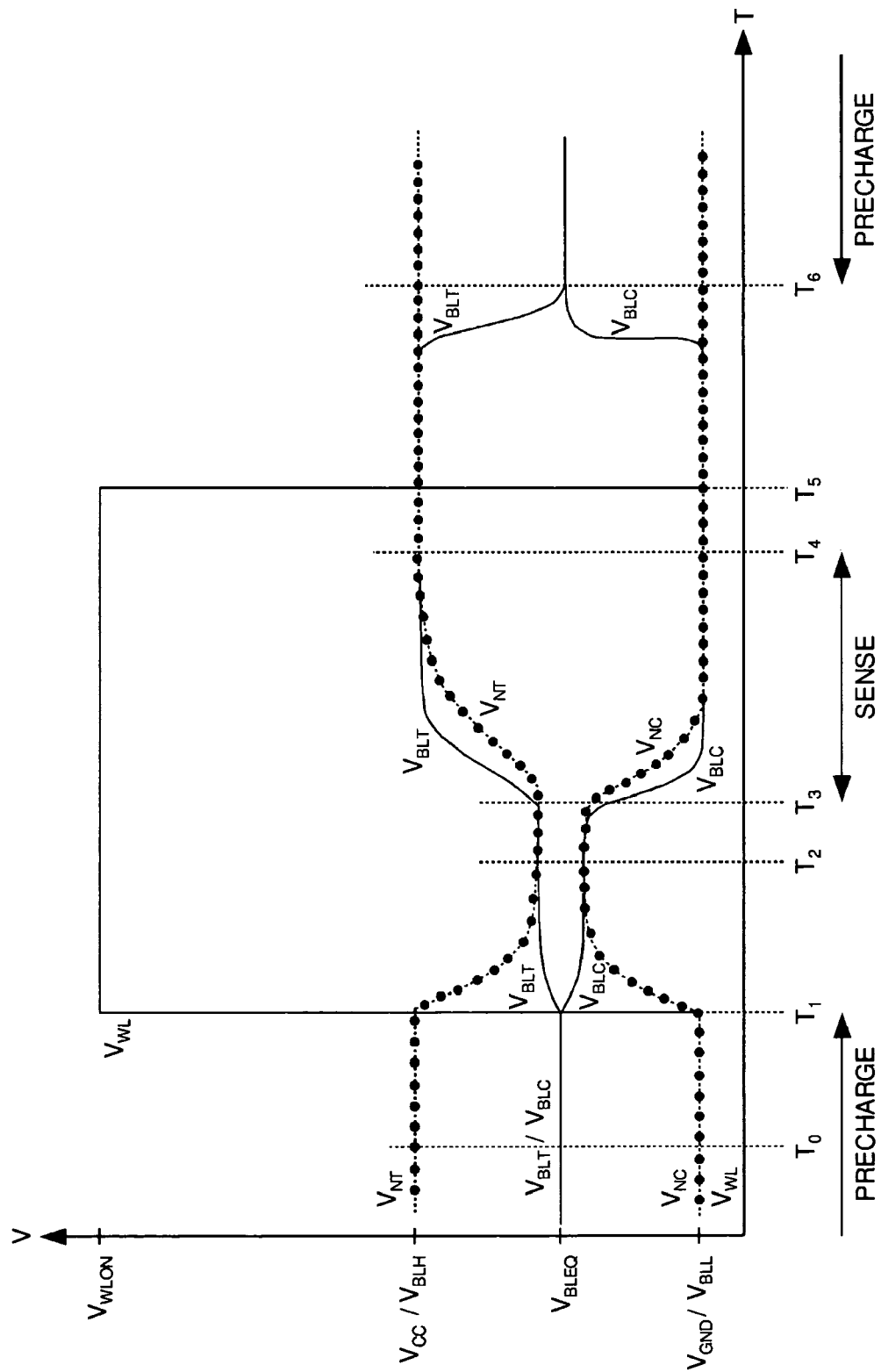
FIG. 2 is a timing diagram depicting an exemplary access of a memory cell.
Figure 3:
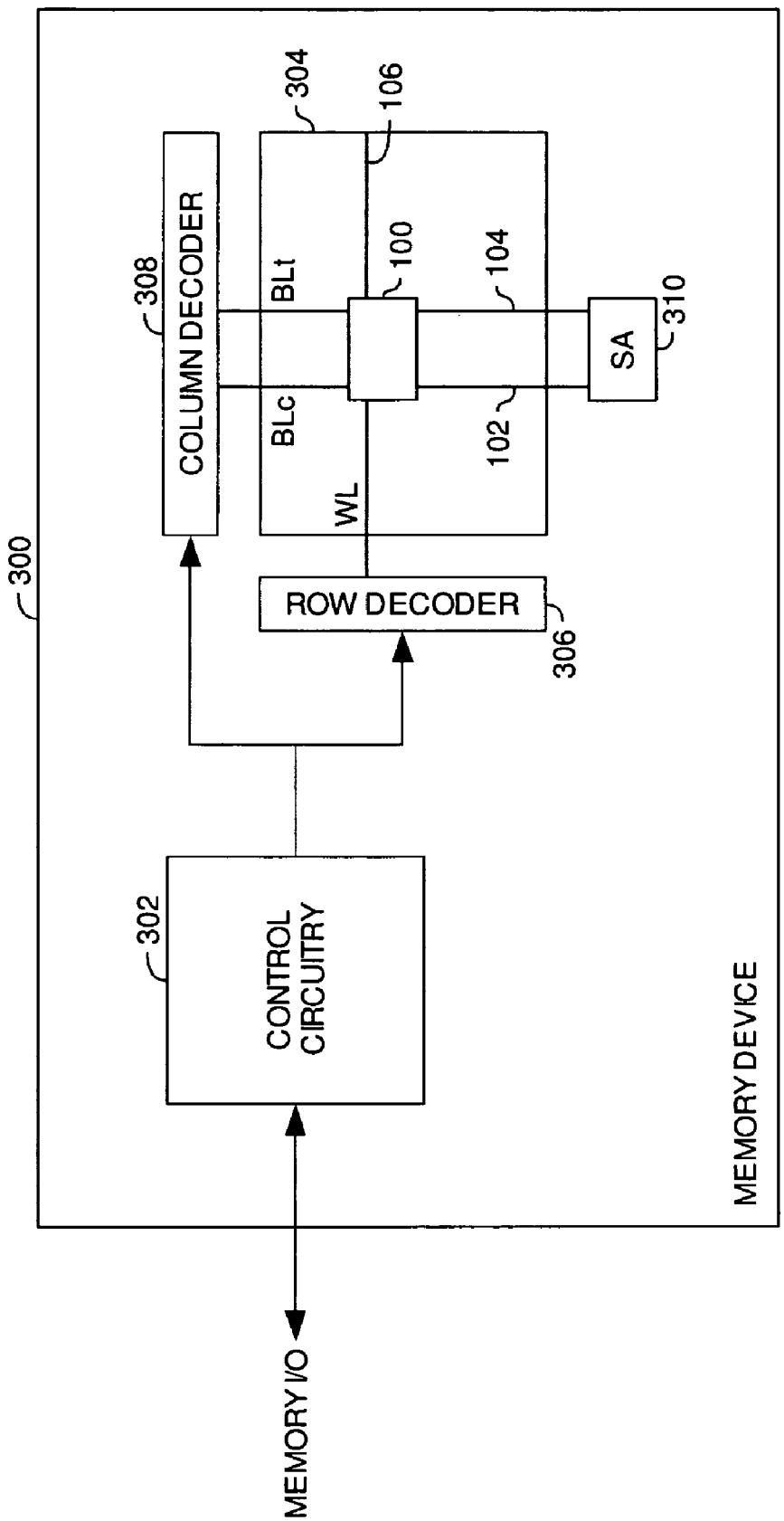
FIG. 3 is a block diagram depicting a memory device according to one embodiment of the invention.

FIG. 3 is a block diagram depicting an exemplary memory device 300 according to one embodiment of the invention. As depicted, the memory device 300 may contain control circuitry 302 and a memory array 304. While a single memory array is depicted, in some cases, the memory device 300 may have multiple memory arrays.

A row decoder 306 and a column decoder 308 may be used to access the memory array 304. For example, the row decoder 306 and column decoder 308 may receive an address from the control circuitry 302 (which may, in turn, receive the address from memory I/O). The row decoder 306 and column decoder 308 may use the address to select a wordline 106 in the memory array 304. When the wordline 106 is selected (e.g., by asserting the wordline voltage $V_{WL}$ to $V_{WLON}$), data stored in a twin memory cell 100 may be detected and amplified by sense amplifier 310 via true and complementary bitlines 104, 102. In some cases, memory cells in the memory array 304 may be arranged in cell blocks. Also, in some cases, the memory array 304 may utilize a segmented wordline architecture or a stitched wordline architecture.

Figure 4:
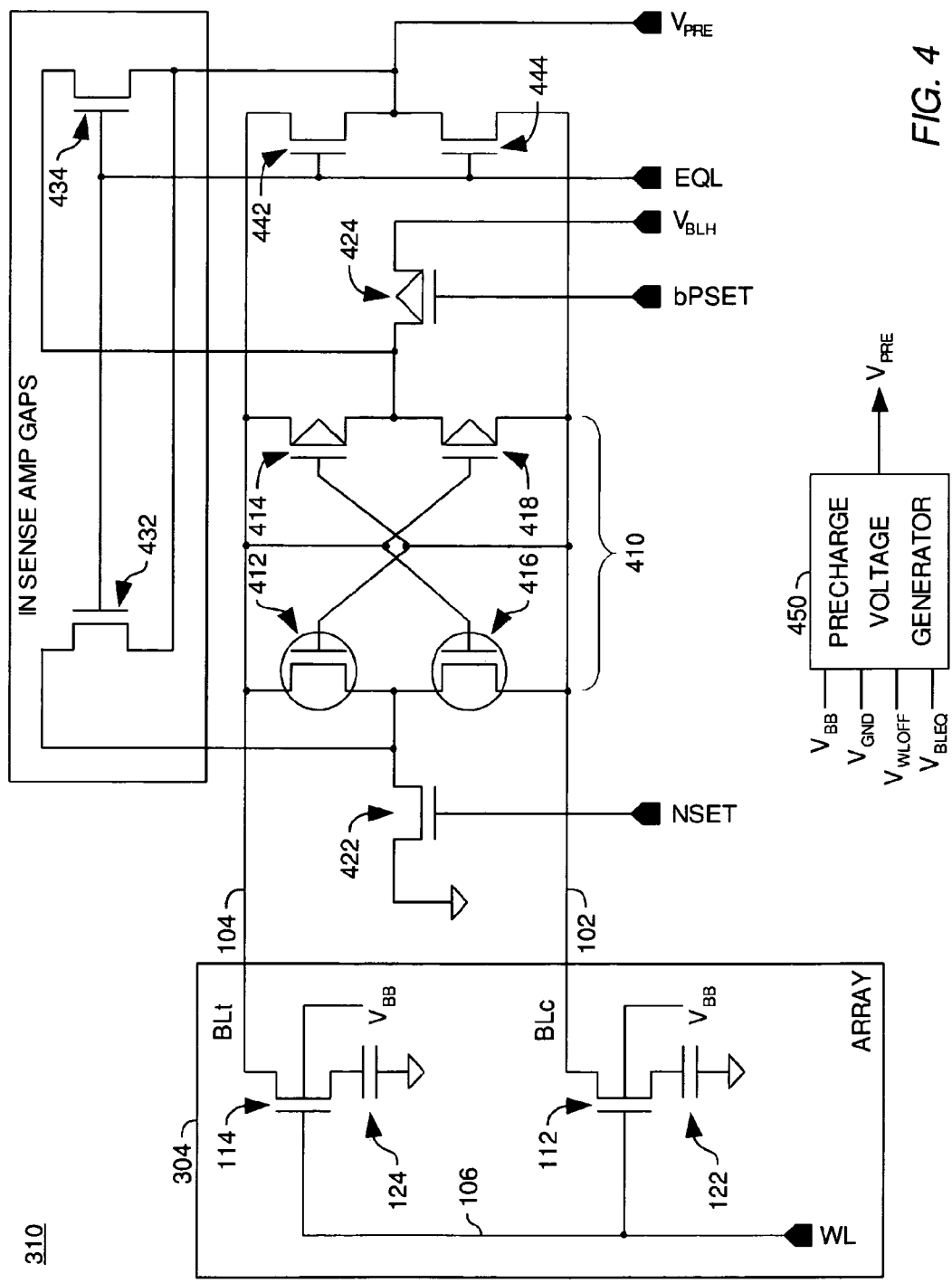
FIG. 4 is a block diagram depicting a memory cell and a sense amplifier according to one embodiment of the invention.

FIG. 4 is a block diagram depicting the memory cell 304 and sense amplifier 310 according to one embodiment of the invention. As depicted, the sense amplifier 310 may contain a latch 410 which is used to amplify a voltage difference across bitlines 102, 104. The latch 410 may be implemented as a cross-coupled inverter which is formed by NMOS transistors 412, 416 and PMOS transistors 414, 418. NMOS transistors 422, 424 controlled by the NSET and bPSET signals respectively may be used to enable and disable the latch 410 as described below. NMOS transistors 432, 434, 442, 444, which are controlled by the equalize signal EQL, may be used, as described below, to precharge the sense amplifier 310 and bitlines 102, 104 to the precharge voltage, $V_{PRE}$. In one embodiment, the precharge voltage $V_{PRE}$ may be generated by the precharge voltage generator 450.

Figure 5:
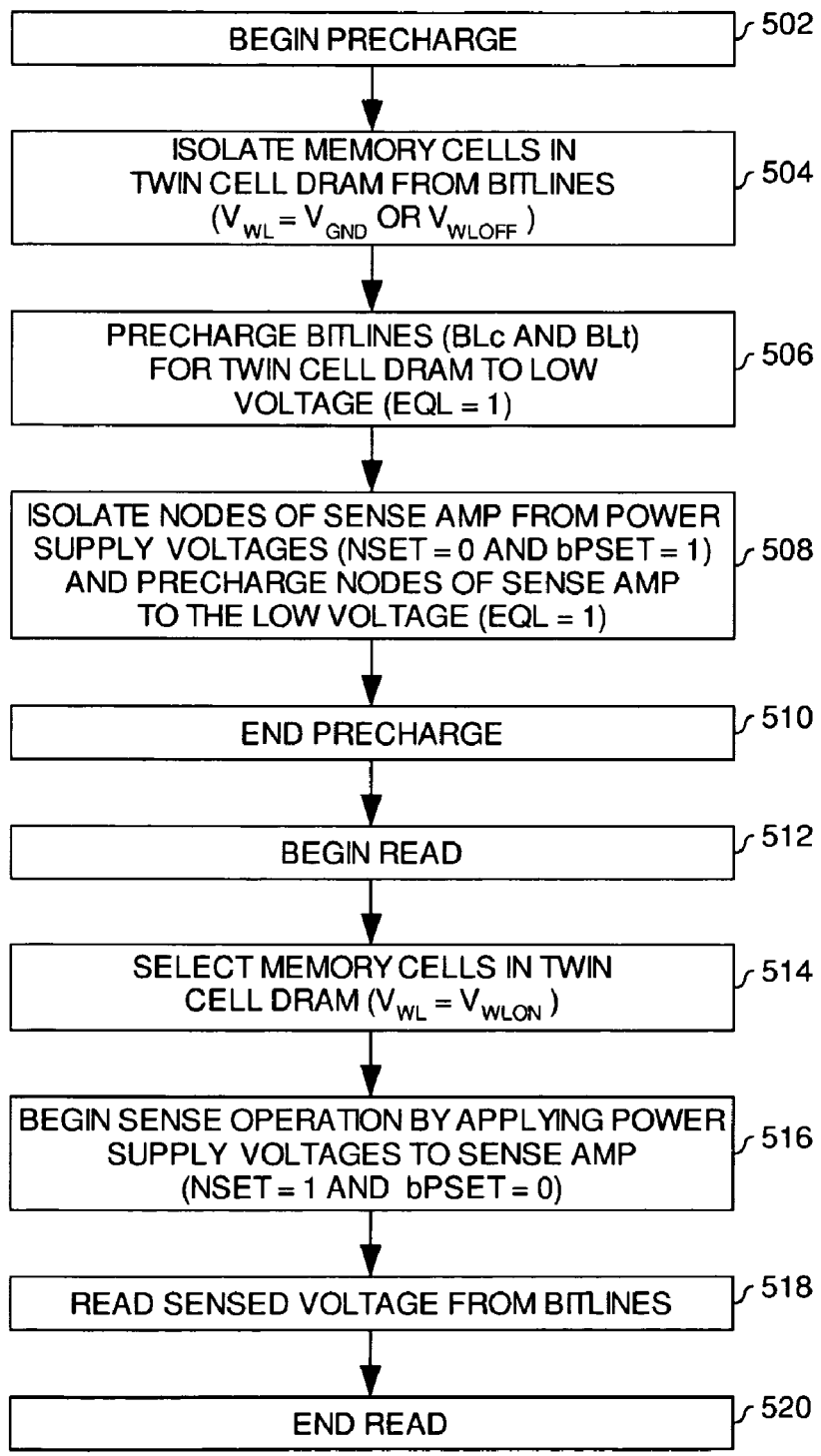
FIG. 5 is a flow diagram depicting a process of accessing a memory cell according to one embodiment of the invention.

FIG. 5 is a flow diagram depicting a process 500 of accessing a memory cell 100 according to one embodiment of the invention. While described with respect to a read of the memory cell 100, it should be readily apparent to one of ordinary skill in the art that the method may be readily adapted for other types of access to the memory cell 100 such as writing or refreshing the memory cell 100.

The access may begin at step 502 wherein a precharge is initiated. At step 504, the memory cells 100 in the twin cell DRAM 300 may be isolated (e.g., disconnected) from the bitlines 102, 104 in the memory device 300 by lowering the wordline voltage $V_{WL}$ to the ground voltage $V_{GND}$ or the wordline off voltage $V_{WLOFF}$.

At step 506, the bitlines BLc and BLt may be precharged to a low voltage by asserting the EQL signal (EQL=1). By asserting EQL, NMOS transistors 442, 444 may be turned on, thereby precharging bitlines 102, 104 to the low voltage supplied by $V_{PRE}$. As used herein, a low voltage is a voltage low enough to turn an NMOS transistor of the memory device 200 off. The low voltage may include a ground voltage $V_{GND}$ or a lower voltage such as a back bias voltage $V_{BB}$, or a wordline off voltage $V_{WLOFF}$. By precharging to the low voltage, the voltage difference between the bitlines 102, 104 and the wordline 106 may be reduced. Thus, any power consumption due to a short 130 between a bitline 102 and wordline 106 may be reduced or eliminated. Similarly, by precharging to the low voltage, a voltage difference across a junction of NMOS access transistors 112, 114 (e.g., the voltage difference between the precharged bitline voltages applied to the source of the transistors 112, 114 and the back-bias voltage $V_{BB}$ applied to the substrate of the transistors 112, 114) may be reduced. By reducing the junction voltage of the NMOS transistors 112, 114, power consumption due to junction leakage current $I_L$ may be reduced or eliminated.

At step 508, the nodes of the latch portion 410 of the sense amplifier 310 may be isolated from the power supply voltages $V_{GND}$ and $V_{BLH}$ applied by NMOS transistor 422 and PMOS transistor 424, respectively, and the nodes of the sense amp may be precharged to the low voltage supplied by $V_{PRE}$. The low voltage may be applied to the sense amp 310 by asserting the equalize signal EQL. When EQL is asserted, NMOS transistors 432, 434 may be turned on, thereby precharging the latch 410 to the low voltage supplied by $V_{PRE}$. By precharging the latch 410, the sense amplifier 310 may be ready to sense and amplify a voltage difference between the precharged bitlines 102, 104 as described below. After the bitlines 102, 104 and sense amplifier 310 are precharged, the precharge may end at step 510.

At step 512, a read of the memory cell 100 may begin. According to one embodiment, the memory cell 100 may be selected at step 514, for example, by asserting the wordline voltage $V_{WL}$ (e.g., $V_{WL}=V_{WLON}$) for the wordline 106 connected to the NMOS access transistors 112, 114 of the memory cell 100. By asserting $V_{WL}$, the transistors 112, 114 may be turned on, thereby creating a voltage difference across the bitlines 102, 104.

According to one embodiment of the invention, because the twin memory cell 100 provides a stored value and a complement of the stored value to the bitlines 102, 104 to create the voltage difference across the bitlines 102, 104, the voltage difference across the bitlines 102, 104 may be created without using a separate reference memory cell to establish the voltage difference (e.g., by connecting the reference memory cell to a bitline 102, 104, wherein the reference memory cell is activated by a wordline other than wordline 106 or wherein the reference memory cell does not necessarily contain a compliment of a data value being accessed).

At step 516, a sense operation may begin by applying power supply voltages to the sense amplifier 310. For example, the voltages $V_{GND}$ and $V_{BLH}$ may be applied to the latch portion 410 of the sense amplifier 310 through transistors 422 and 424, respectively, e.g., by asserting the NSET signal applied to NMOS transistor 422 and by lowering the bPSET signal applied to PMOS transistor 424. When the power supply voltages are applied to the latch 410, the latch may sense and amplify the voltage difference created across the bitlines 102, 104 by the data value and the compliment of the data value stored in the memory cell 100.

At step 518, the sensed voltage difference may be read from the bitlines 102, 104, for example, by connecting the bitlines 102, 104 to main data lines of the memory device 300. At step 520, the read operation may end.

Figure 6:
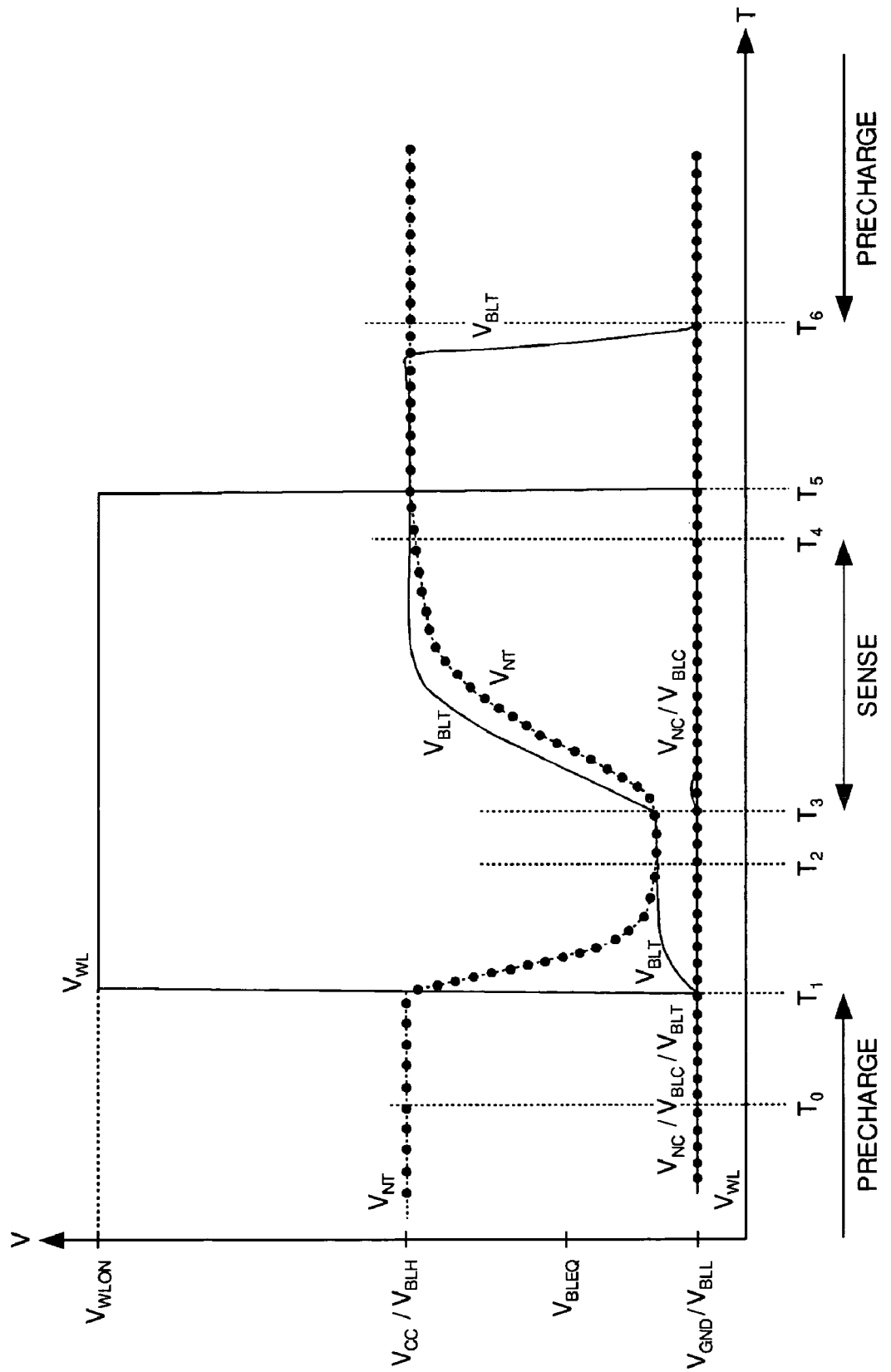
FIG. 6 is a timing diagram depicting an access of a memory cell according to one embodiment of the invention.

FIG. 6 is a timing diagram depicting an access of a memory cell according to one embodiment of the invention. At time $T_0$ before the access, the wordline voltage $V_{WL}$ may be a low voltage (e.g., a ground voltage $V_{GND}$ or a wordline off voltage $V_{WLOFF}$), thereby disconnecting capacitors 122, 124 from the bitlines 102, 104. As depicted, a high voltage ($V_{NT}=V_{CC}$) may be stored in the "true" capacitor 122 of the memory cell 100 and a low voltage ($V_{NC}=V_{GND}$) may be stored in the complementary capacitor 124.

Before the memory cell 100 is accessed, the bitlines 102, 104 may be precharged to the low voltage supplied by $V_{PRE}$ (e.g., the ground voltage, $V_{GND}$). Thus, as described above, by precharging to a low voltage, leakage currents during precharge may be reduced or eliminated.

The access of the memory cell 100 may begin at time $T_1$ when $V_{WL}$ is asserted to the wordline on voltage $V_{WLON}$. As described above, $V_{WLON}$ may be sufficient to turn the NMOS transistors 112, 114 on (e.g., to place the transistors 112, 114 in a conducting state). When the NMOS transistors 112, 114 are turned on, the voltages $V_{NT}$, $V_{NC}$ stored in the capacitors 122,124 may be driven onto the bitlines 102, 104. Because the data values stored in capacitors 122, 124 are complements of each other, at least one of the capacitors will pull a corresponding bitline 102, 104 upwards, while the other bitline will remain at the low precharge voltage. Because at least one bitline will be pulled upwards by the memory cell 100 while the other bitline remains at a low voltage, the sense amplifier 310 will be able to sense and amplify the data values output on the true and complementary bitlines 102, 104 (e.g., a '0' and a '1' for the true and complementary bitlines 102, 104, or a '1' and a '0' for the true and complementary bitlines 102, 104, respectively).

Accordingly, as the voltages stored in the capacitors 122, 124 are driven onto the bitlines 102, 104, a voltage difference ($V_{BLT}-V_{BLC}$) between the voltage of the true ($V_{BLT}$) and complementary ($V_{BLC}$) bitlines 122, 124 may be created, e.g., at time $T_2$. At time $T_3$, the sense amplifier 310 connected to the bitlines 102, 104 may be enabled by asserting NSET and lowering bPSET, thereby applying power supply voltages $V_{GND}$ and $V_{BLH}$ to the latch portion 410 of the sense amplifier 310. The sense amplifier 310 may then sense and amplify the voltage difference $V_{BLT}-V_{BLC}$ created by the memory cell 100 on the bitlines 102, 104.

Thus, at time $T_3$ and continuing to time $T_4$, the voltage difference $V_{BLT}$-$V_{BLC}$ may be amplified, driving $V_{BLT}$ upwards to the bitline high voltage ($V_{BLH}$) and driving $V_{BLC}$ downwards to the bitline low voltage ($V_{BLL}$). Because the transistors 112, 114 may continue to be turned on (e.g., because $V_{WL}$=$V_{WLON}$), $V_{NT}$ may also be driven upwards to $V_{BLH}$ while $V_{NC}$ is driven downwards to $V_{BLL}$.

At time $T_5$, $V_{WL}$ may be lowered (e.g., to $V_{WLOFF}$ or $V_{GND}$), thereby disconnecting the capacitors 122, 124 from the bitlines 102, 104 and completing the access. Later, at time $T_6$, the bitlines 102, 104 may be precharged by driving $V_{BLT}$ and $V_{BLC}$ to the low voltage supplied by $V_{PRE}$, thereby preparing the bitlines 102, 104 for a subsequent access.

Further Embodiments

As described above, precharging the bitlines 102, 104 to a low voltage may reduce leakage currents in the memory device 300. In one embodiment, the bitlines may be precharged to the ground voltage $V_{GND}$, e.g., by connecting $V_{PRE}$ to $V_{GND}$. However, because the wordline off voltage $V_{WLOFF}$ and the back bias voltage $V_{BB}$ may not be equal to the ground voltage $V_{GND}$ (e.g., $V_{WLOFF}$ and $V_{BB}$ may be negative voltages), in some cases, the bitlines 102, 104 may be precharged to a low voltage other than $V_{GND}$.

For example, in one embodiment, to reduce a BL-WL voltage difference, and therefore reduce power consumption due to a BL-WL short 130, the precharge voltage $V_{PRE}$ may be set/equal to $V_{WLOFF}$. Optionally, in one embodiment, to reduce the junction leakage current $I_L$ and the corresponding power consumption, the precharge voltage $V_{PRE}$ may be set/equal to $V_{BB}$, thereby reducing the junction voltage across access transistors 112, 114.

According to one embodiment of the invention, the precharge voltage $V_{PRE}$ may be a constant voltage as described above. Optionally, the precharge voltage generator 450 may be configured to select the precharge voltage $V_{PRE}$ based on a signal from the control circuitry 302. Optionally, the precharge voltage setting may be selected externally, e.g., by issuing a command to the memory device 300 such as a mode register set command or other command.

In some cases, the precharge voltage generator 450 may apply one of several selectable voltages, e.g., $V_{WLOFF}$, $V_{BB}$, or $V_{GND}$. Optionally, the precharge voltage generator 450 may provide a plurality of voltages. For example, in one embodiment, the precharge voltage generator 450 may provide a precharge voltage $V_{PRE}$ which is trimmable (e.g., an adjustable value) between the low voltages $V_{WLOFF}$, $V_{BB}$, or $V_{GND}$. Optionally, the precharge voltage generator 450 may provide voltage settings which are incremental between two voltages. For example, the precharge voltage generator 450 may provide selectable precharge voltages for $V_{PRE}$ between the ground voltage $V_{GND}$ and back-bias voltage $V_{BB}$ in, for example, eight increments. In one embodiment, a $V_{PRE}$ setting may be selected depending on a temperature sensed using an on-chip temperature sensor.

In some cases, where $V_{PRE}$ is adjustable, $V_{PRE}$ may be adjusted to minimize power consumption of the memory device 300. For example, during a test of the memory device 300, the memory device 300 may be operated (e.g., by a test unit) with multiple $V_{PRE}$ settings such as one of the settings described above. While the memory device 300 is being operated with each $V_{PRE}$ setting, the power consumption of the memory device 300 may be monitored and stored as a value. Using the monitored power consumption values, the $V_{PRE}$ setting which results in the lowest power consumption may be determined. The memory device 300 may then use the determined $V_{PRE}$ setting during normal operation. For example, the $V_{PRE}$ setting may be selected using a command issued to the memory device 300 or the $V_{PRE}$ setting may be programmed into the memory device 300, e.g., by blowing one or more fuses such as electronically programmable fuses (e-fuses) or laser fuses which store the $V_{PRE}$ setting.

In one embodiment, the precharge voltage generator 450 may be used during a test to precharge the bitline 102, 104 to a voltage which is not a low voltage, such as $V_{BLEQ}$ ($V_{BLEQ}$ may be midway between $V_{BLH}$ and $V_{BLL}$). For example, to test a single cell (e.g., one capacitor and one access transistor) of the twin memory cell 100, the bitlines 102, 104 may be precharged to $V_{BLEQ}$. By precharging the bitlines 102, 104 to $V_{BLEQ}$, the value stored in the single memory cell of the twin memory cell 100 may be sensed and amplified by the sense amplifier 310 without using another single cell (e.g., the other single cell in the twin memory cell 100) to provide a reference voltage.

In one embodiment, the precharge voltage generator 450 may also be used to provide an increased voltage (e.g., a high voltage or $V_{BLEQ}$) for $V_{PRE}$ during a test of the memory device 300. The increased voltage may be provided, for example, to increase the stress placed on the memory device 300 during the test. After the test, the precharge voltage generator 450 may then be used to provide a low voltage as described above.

In one embodiment of the invention, the drive strength of the sense amplifier 310 may be increased. The drive strength of the sense amplifier may be increased, for example, to better sense the small positive voltage driven onto either the true or complementary bitlines 104, 102 by the memory cell 300 during an access (e.g., the small positive voltage of $V_{BLT}$ on the bitline BLt depicted at time $T_2$ in FIG. 6). To increase the drive strength of the sense amplifier 310, the size of the PMOS transistors 414, 418 in the latch portion 410 of the sense amplifier 310 may be increased.

For example, a typical PMOS transistor in the memory device 300 may have a width W which corresponds to a feature size of the process used to make the memory device 300. To increase the size if the PMOS transistors 414, 418, the width of the transistors 414, 418 may be increased, for example, to double the width (2 W) or quadruple the width (4 W) of other PMOS transistors in the memory device. Increasing the size of PMOS transistors 414, 418 may improve the ability of the sense amplifier 310 to sense the small positive voltage provided by the memory cell 100 because the PMOS transistors 414, 418 may be used more than the NMOS transistors 412, 416 by the latch 410 to amplify a positive voltage (e.g., because the PMOS transistor may conduct a positive voltage better than an NMOS transistor and because the PMOS transistors 414, 418 may be connected to the high voltage $V_{BLH}$). The increased driver strength of the sense amp 310 may also compensate where one of the single memory cells in the twin memory cell 100 is defective (e.g., provides a weak signal for the stored data value), thus compensating for the fact that $V_{BLEQ}$ (which may have been used to sense the data value stored in a single, non-defective memory cell) is no longer used as the precharge voltage $V_{PRE}$.

In some cases, the current of a refresh operation may be dependent on the level of $V_{BLH}$, for example, because of the large capacitance (e.g., each of the bitlines along a wordline) being charged and discharged. Where $V_{BLH}$ is a low value, less refresh current may be used, but a lower $V_{BLH}$ may also cause stored charge to deteriorate more quickly than a higher $V_{BLH}$, thereby requiring more frequent refreshes than would otherwise be necessary. Where $V_{BLH}$ is a higher value, more refresh current may be used, but a higher $V_{BLH}$ may also require fewer refreshes. Thus, a trade-off of between power consumption and retention time may be created when determining the appropriate level for $V_{BLH}$. In one embodiment of the invention, $V_{BLH}$ may be adjusted to minimize the power consumption of the memory device while maintaining the highest retention time for stored charge (with a larger resulting refresh period), thereby creating an optimal balance between power consumption and retention time.

While the foregoing is directed to embodiments of the present invention, other and further embodiments of the invention may be devised without departing from the basic scope thereof, and the scope thereof is determined by the claims that follow.

What is claimed is:

1. A method of accessing a twin cell memory device, wherein the memory device comprises a twin memory cell, wherein the twin memory cell stores a data value and a complement of the data value, and wherein the data value and the complement of the data value may be accessed via a first bitline and a second bitline of the memory device, respectively, the method comprising:
   precharging the first bitline and the second bitline to a low voltage, wherein the low voltage is a voltage lower than a ground voltage of the memory device;
   asserting a wordline voltage to access the twin memory cell; and
   sensing a voltage difference between the first and second bitline of the memory device, the voltage difference created by the data value and the complement of the data value.

2. The method of claim 1, wherein the low voltage is a wordline off voltage.

3. The method of claim 1, wherein the low voltage is a back bias voltage.

4. The method of claim 1, wherein the low voltage is applied by a precharge voltage generator of the memory device, the precharge voltage generator being configured to select the low voltage from any voltage less than a ground voltage and not less than a wordline off voltage of the memory device.

5. The twin cell memory device of claim 1, wherein the low voltage is a back bias voltage applied to a substrate of the twin cell memory device.

6. A twin cell memory device comprising:
   a first bitline and a second bitline;
   a twin memory cell, wherein the twin memory cell stores a data value and a complement of the data value, and wherein the data value and the complement of the data value may be accessed via the first bitline and the second bitline,
   circuitry configured to:
      precharge the first bitline and the second bitline to a low voltage, wherein the low voltage is a voltage lower than a ground voltage of the memory device;
      assert a wordline voltage to access the twin memory cell; and
      sense a voltage difference between the first and second bitline of the memory device, the voltage difference created by the data value and the complement of the data value.

7. The twin cell memory device of claim 6, wherein the low voltage is a wordline off voltage.

8. The twin cell memory device of claim 6, wherein the low voltage is a back bias voltage.

9. The twin cell memory device of claim 6, further comprising:
   a precharge voltage generator configured to apply the low voltage, the precharge voltage generator being configured to select the low voltage from any voltage less than a ground voltage and not less than a wordline off voltage of the memory device.

10. A twin cell memory device comprising:
    a first bitline and a second bitline;
    means for storing, wherein the means for storing stores a data value and a complement of the data value, and wherein the data value and the complement of the data value may be accessed via the first bitline and the second bitline,
    means for controlling configured to:
       precharge the first bitline and the second bitline to a low voltage, wherein the low voltage is a voltage lower than a ground voltage of the memory device;
       assert a wordline voltage to access the means for storing; and
       sense a voltage difference between the first and second bitline of the memory device, the voltage difference created by the data value and the complement of the data value.

11. The twin cell memory device of claim 10, wherein the low voltage is a wordline off voltage used to deactivate a wordline of the twin cell memory device.

12. The twin cell memory device of claim 10, further comprising:
    precharge voltage generating means for selecting and applying the low voltage, wherein the low voltage is selected from between at least two voltages of a group, the group comprising:
       the ground voltage, a wordline off voltage used to deactivate a wordline of the twin cell memory device, and a back bias voltage applied to a substrate of the twin cell memory device.

13. A memory device comprising:
    a plurality of twin memory cells, wherein each twin memory cell includes first and second access transistors controlled by a wordline to connect first and second capacitors, with voltages representing complementary data values, to first and second bitlines, respectively; and
    control circuitry configured to:
       deactivate the wordline by lowering a wordline voltage of the wordline to a wordline off voltage, wherein the wordline off voltage is lower than a ground voltage of the memory device; and
       precharge the plurality of first and second bitlines to a low voltage lower than the ground voltage of the memory device.

14. The memory device of claim 13, wherein the control circuitry is further configured to:
    access a twin memory cell, wherein accessing the twin memory cell comprises:
       asserting the wordline voltage of the wordline which controls the first and second access transistors for the twin memory cell;
       activating a sense amplifier connected to the first bitline and the second bitline for the twin memory cell, wherein the sense amplifier amplifiers a voltage difference between the first bitline and the second bitline, the voltage difference created by the voltages representing complementary data values.

15. The memory device of claim 14, wherein a drive strength of the sense amplifier is increased by increasing a width of PMOS transistors of the sense amplifier with respect to other PMOS transistors in the memory device.

16. The memory device of claim 13, further comprising:
a precharge voltage generator configured select the low voltage used to precharge the plurality of first and second bitlines.

17. The memory device of claim 13, wherein a high voltage of the memory device applied to the bitlines by the plurality of senses amplifiers is decreased to compensate for a shortened retention time of the plurality of twin memory cells.

18. A method of accessing a twin cell memory device, wherein the memory device comprises a twin memory cell, wherein the twin memory cell stores a data value and a complement of the data value, and wherein the data value and the complement of the data value may be accessed via a first bitline and a second bitline of the memory device, respectively, the method comprising:
  selecting a precharge voltage from a group of possible precharge voltages, the group comprising at least two of the following voltages:
    a ground voltage, a wordline off voltage, and a back bias voltage; wherein the wordline off voltage and the back bias voltage are lower than the ground voltage;
  precharging the first bitline and the second bitline to the selected precharge voltage;
  asserting a wordline voltage to access the twin memory cell; and
  sensing a voltage difference between the first and second bitline of the memory device, the voltage difference created by the data value and the complement of the data value.

19. A twin cell memory device comprising:
a first bitline and a second bitline;
a twin memory cell, wherein the twin memory cell stores a data value and a complement of the data value, and wherein the data value and the complement of the data value may be accessed via the first bitline and the second bitline,
circuitry configured to:
  i) select a precharge voltage from a group of possible precharge voltages, the group comprising at least two of the following voltages:
    a ground voltage, a wordline off voltage, and a back bias voltage; wherein the wordline off voltage and the back bias voltage are lower than the ground voltage;
  precharge the first bitline and the second bitline to the selected precharge voltage;
  ii) assert a wordline voltage to access the twin memory cell; and
  iii) sense a voltage difference between the first and second bitline of the memory device, the voltage difference created by the data value and the complement of the data value.

20. The memory device of claim 13, wherein the low voltage is one of the wordline off voltage and a back bias voltage, wherein the back bias voltage is a voltage applied to a substrate of the memory device.

* * * * *